United States Patent
Poulton et al.

(10) Patent No.: US 7,206,907 B2
(45) Date of Patent: Apr. 17, 2007

(54) REDUCTION OF NOISE AND TEMPERATURE VARIATION IN MIXED-SIGNAL INTEGRATED CIRCUITS

(75) Inventors: Kenneth D. Poulton, Palo Alto, CA (US); Thomas E. Kopley, La Honda, CA (US)

(73) Assignee: Agilent Technologies, Inc, Santa Clara, CA (US)

( * ) Notice: Subject to any disclaimer, the term of this patent is extended or adjusted under 35 U.S.C. 154(b) by 476 days.

(21) Appl. No.: 10/750,518

(22) Filed: Dec. 31, 2003

(65) Prior Publication Data

US 2005/0149661 A1   Jul. 7, 2005

(51) Int. Cl.
*G06F 13/38* (2006.01)
*G06F 17/40* (2006.01)

(52) U.S. Cl. .................. 711/154; 711/170; 710/69
(58) Field of Classification Search ........... 711/154, 711/170; 710/69
See application file for complete search history.

(56) References Cited

U.S. PATENT DOCUMENTS 5,649,160 A * 7/1997 Corry et al. ............... 711/167
5,793,318 A    8/1998 Jewett

* cited by examiner

*Primary Examiner*—Brian R. Peugh
*Assistant Examiner*—Jared Rutz (57) ABSTRACT

The present method reduces variations in noise and temperature in a mixed-signal circuit including memory. Memory electrically proximate an analog circuit is provided and a digital data word received at the memory. When the data word is not a desired data word, a dummy write to the memory is performed. When the data word is a desired data word, the data word is written to the memory. The mixed-signal circuit includes an analog circuit, memory electrically proximate to the analog circuit and connected to receive digital data words, and a memory controller connected to the memory. The memory controller is operable to cause the memory to write to the memory each of the data words that is a desired data word and additionally to perform a dummy write to memory for each of the data words that is not a desired data word.

20 Claims, 5 Drawing Sheets

REDUCTION OF NOISE AND TEMPERATURE VARIATION IN MIXED-SIGNAL INTEGRATED CIRCUITS

TECHNICAL FIELD

The technical field of this disclosure is mixed-signal circuits, particularly, mixed-signal circuits in which variations in circuit noise and operating temperature are reduced.

BACKGROUND OF THE INVENTION

Mixed-signal circuits, defined as circuits containing both analog and digital circuits, are plagued by injection of noise from the digital circuits into the sensitive analog circuits. Such noise, commonly known as cross talk, produces errors in the monitored analog information. One major source of digital noise is the embedded memory circuits commonly used in such circuits, as well as the data and control signals to and from the embedded memory circuits.

In addition, the analog circuits are typically temperature-sensitive and their operation is affected by heat generated during digital switching activity. The time constants of thermal events in semiconductor substrates are often on the same order as the time for the circuit to perform sensitive analog operations. Thus, analog performance degrades if chip temperatures vary with varying digital switching activity.

Various techniques for isolating digital noise from the analog circuits have been developed. These include separation of analog and digital power supply and ground lines and isolation of transistors in the digital portion of the circuit within electrically isolated diffusion wells. U.S. Pat. No. 5,793,318 to Jewett describes a system for preventing distortion in an analog-to-digital converter by XORing each bit of the generated digital data with a different pseudo-random bit to generate an encoded digital output signal. This removes all correlation between the analog input signal and the digital output signal.

Such measures for mitigating the effects of digital noise can limit the design and layout of components in integrated circuits as well as increasing integrated circuit complexity.

It would be desirable to have mixed-signal circuits that do not suffer from the above disadvantages.

SUMMARY OF THE INVENTION

Variations in noise and temperature impair the accuracy of the analog portions of mixed-signal circuits. The invention reduces noise and temperature variations in mixed-signal circuits by maintaining a constant level of memory activity. The invention achieves its improvements without limiting the design and layout of the circuit and without increasing circuit complexity.

One aspect of the invention provides a method for reducing variations in noise and temperature in a mixed-signal circuit. Memory electrically proximate an analog circuit is provided and a digital data word received at the memory. The data word is checked to determine whether it is a desired data word. When the data word is not a desired data word, a dummy write to the memory is performed. When the data word is a desired data word, the data word is written to the memory.

Another aspect of the invention provides a mixed-signal circuit having reduced variations in circuit noise and temperature. The mixed-signal circuit includes an analog circuit, memory electrically proximate the analog circuit and connected to receive digital data words, and a memory controller connected to the memory. The memory controller is operable to cause the memory to write to the memory each of the data words that is a desired data word and additionally to perform a dummy write to memory for each of the data words that is not a desired data word.

The above and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENTS

The invention is based on the observation that the above-described problems arising from variations in circuit noise and operating temperature to which many types of conventional mixed-signal circuits are subject are the result of the memory portions of such circuits operating intermittently. Such intermittent operation of the memory generates bursts of noise whose effects are substantially more difficult to mitigate than continuous noise of a comparable amplitude. Similarly, such intermittent operation of the memory causes variations in the power consumed by the memory and, hence, in the operating temperature of the circuit and of the analog circuits in particular. Thus, in accordance with the invention, the memory is operated continuously so that noise is continuously generated and power is continuously consumed. This way, variations in circuit noise and operating temperature are reduced.

Figure 1:
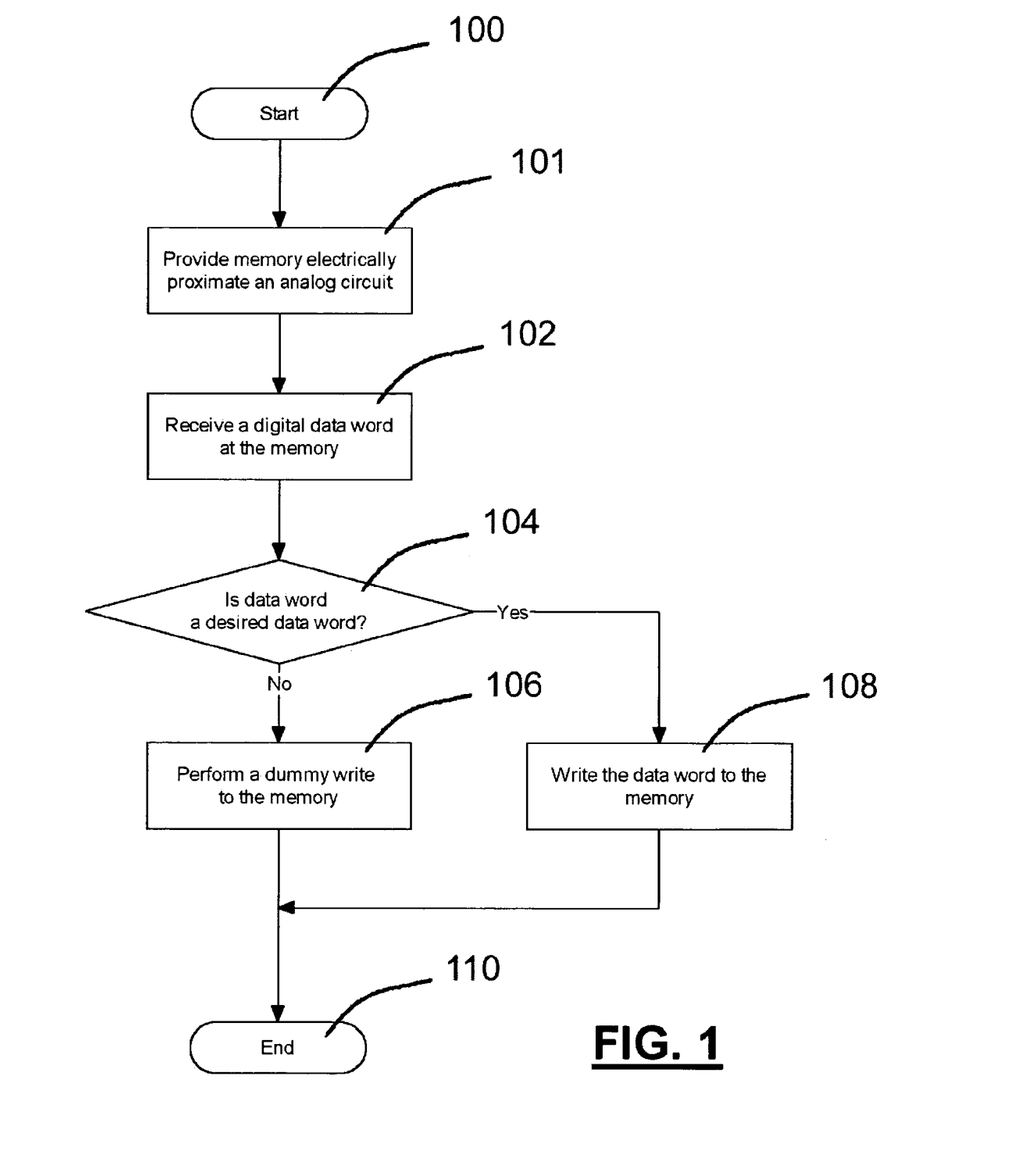
FIG. 1 is a flow chart showing an embodiment of a method according to the invention for reducing variations in noise and temperature in a mixed-signal circuit.

FIG. 1 shows a flow chart of an embodiment of a method in accordance with the invention for reducing variations in noise and temperature in a mixed-signal circuit that includes memory. In the method, digital data words are received at the memory. However, only certain ones of the data words are desired data words. As used in this disclosure, the term word is used to denote the unit of the digital data fed to the memory, and is not limited to 8-bit words.

Conventionally, storing such desired data words in memory causes the memory to operate intermittently. Operating the memory intermittently causes circuit noise to vary and the power consumption of the memory to vary, as described above.

In accordance with the invention, data words that are determined to be desired data words are written to memory for later use. Additionally, for each data word that is not determined to be a desired data word, a dummy write to memory is performed. A write to memory is therefore performed on every clock cycle. Performing a write to memory on every clock cycle reduces variations in circuit noise and operating temperature.

In different embodiments of the method, performing the dummy write to memory writes any data word to a dummy memory, a dummy data word to any memory, a dummy data word to dummy memory, or any data word to any memory.

The method starts at block 100. In block 101, memory electrically proximate an analog circuit is provided. The memory is electrically proximate the analog circuit when memory activity generates noise or signals detectable at the analog circuit. In block 102, a digital data word is received at the memory. In block 104, a determination is made as to whether the data word is a desired data word, i.e., a data word to be written to memory for later readout and use. In some embodiments, the determination involves determining whether external logic has provided a signal identifying the data word as a desired data word. In other embodiments, the determination involves no examination of the data word. Instead, the order in which the data word is generated determines whether the data word is a desired data word. For example, every n-th data word generated in block 102 may be determined to be a desired data word, where n is an integer.

Block 106 is performed when the data word is determined not to be a desired data word. In block 106, a dummy write to memory is performed. The method then ends at block 110. The dummy write can involve writing any data word to dummy memory, writing a dummy data word to any memory, writing a dummy data word to dummy memory, or writing any data word to any memory. Block 108 is performed when the data word is identified as a desired data word. In block 108, the data word is written to the memory. The method then ends at block 110. In one embodiment, the method starts again at 100.

The method is applicable to any mixed-signal circuit that has analog and digital signals in the same circuit. In one example, the mixed-signal circuit is an analog-to-digital converter having on-chip memory to store acquisition data. The activity level in the memory is kept constant by performing a write to memory each clock cycle: either the dummy write to memory performed in block 106 or the data word write to memory performed in block 108. A constant level of memory activity improves the performance of the analog part of the mixed signal circuit by reducing variations in noise and keeping the analog circuit at a constant temperature.

In an alternative embodiment, the analog and digital portions of the mixed-signal circuit are independent of each other. The analog portion need not be wired directly to the digital portion. For example, the mixed-signal circuit can be a mixed-signal chip with a noise or temperature sensitive analog portion and a separate digital memory portion receiving a data word from an embedded processor. In another example, the data word can come from off the mixed-signal chip. The analog portion can be any noise or temperature sensitive circuit and is not limited to an analog-to-digital converter.

Figure 2A:
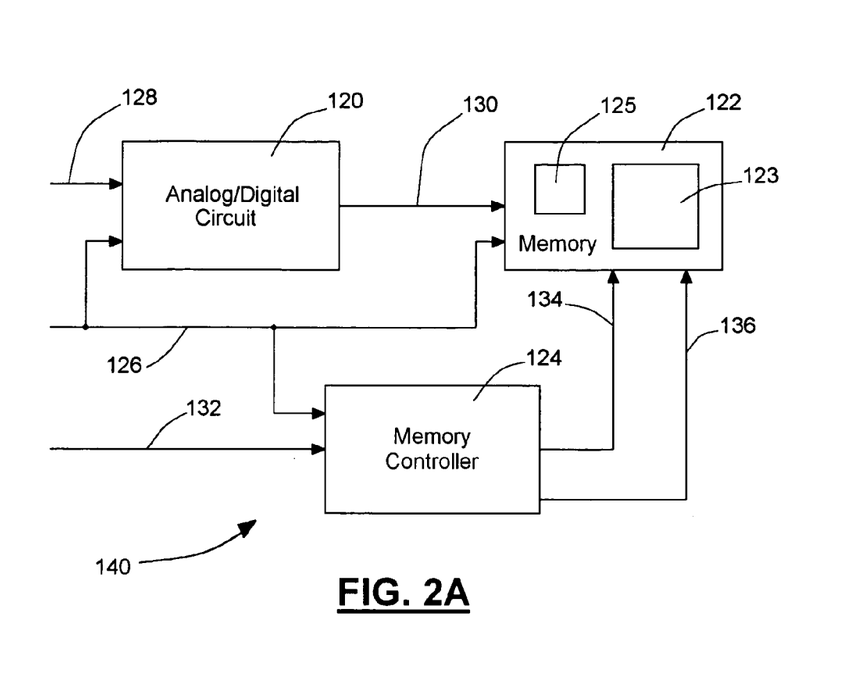
FIGS. 2A and 2B are a block diagram and a timing diagram, respectively, of a mixed-signal circuit having reduced variations in noise and temperature according to an embodiment of the invention.
Figure 2B:
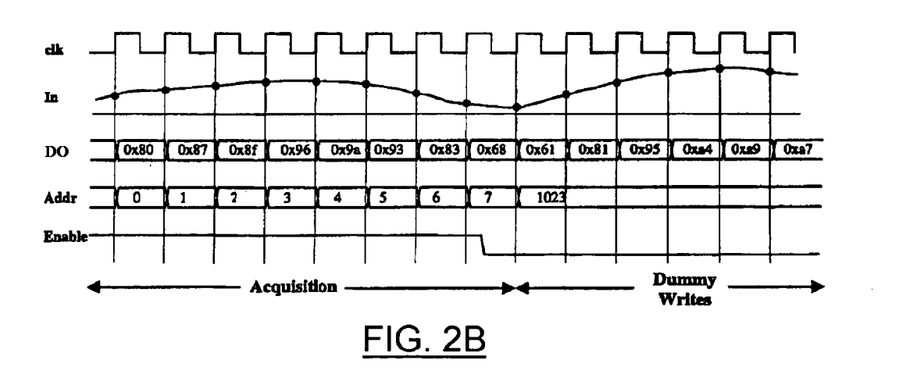

FIGS. 2A and 2B show a block diagram and timing diagram, respectively, of a mixed-signal circuit in which variations in noise and temperature are reduced in accordance with an embodiment of the invention. The circuit performs a write to memory on every clock cycle: some of the writes to memory are dummy writes in which the data words that are not desired data words are written to a dummy memory.

Referring to FIG. 2A, which provides a specific practical example of the present invention, the mixed-signal circuit 140 is composed of an analog/digital circuit 120, memory 122 and a memory controller 124. The memory 122 is electrically proximate to the analog/digital circuit 120, i.e., activity in the memory 122 generates noise or signals detectable at the analog/digital circuit 120. The memory 122 is composed of acquisition memory 123 and dummy memory 125. The dummy memory 125 constitutes a small part of the memory 122 outside the acquisition memory 123 so that when the desired data words are later read out from the acquisition memory, they are not contaminated by data words that are not desired data words. A clock signal 126 provided to each of the components of the circuit 140 coordinates operations and data flow among the components. An analog input signal 128 is provided to the analog/digital circuit 120. The analog/digital circuit 120 processes the analog input signal 128 and generates digital data words 130, which are fed to the memory 122. The analog/digital circuit 120 can be any circuit that receives an analog input and generates an output of digital words. In one embodiment, the analog/digital circuit 120 is an analog-to-digital converter, and the digital words digitally represent time samples of the analog input signal.

The memory controller 124 operates in response to an enable signal 132, and provides an address signal 134 and a read/write signal 136 to the memory 122. The memory controller may be structured as part of the memory 122. The enable signal 132 is an external signal that indicates whether each of the data words 130 is a desired data word.

FIG. 2B shows a timing diagram for the mixed-signal circuit 140 shown in FIG. 2A. The clock signal 126 (clk) is provided to each of the components of the circuit 140 to coordinate operations and data flow. The analog input signal 128 (In) is any analog signal, shown here varying in amplitude over time. The data words 130 (DO) are N-bit binary data words generated by the analog/digital circuit 120 in response to the analog input signal 128 (In). The analog/digital circuit 120 outputs a digital data word every clock cycle. The address signal 134 (Addr) determines the location in memory 122 to which each data word 130 (DO) is to be written. The enable signal 132, which has an acquisition value and a dummy value, directs the memory controller 124 to generate the address signal 134 (Addr) in such a manner that the memory writes each data word 130 (DO) that is a desired data word to the acquisition memory 123 and performs a dummy write of each data word 130 (DO) that is not a desired data word to the dummy memory 125.

In this example, the enable signal 132 is at the acquisition value at the beginning of each of the first eight cycles of the clock signal clk. The enable signal 132 at the acquisition value indicates that the data word (DO) generated in each of the clock cycles is a desired data word. In response to the enable signal at the acquisition value, the memory controller generates the address signal 134 in successive addresses that cause the memory to write the respective data words to memory locations 0 through 7. Memory locations 0 through 7 are locations in acquisition memory 123, i.e., the part of memory 122 used to store the desired data words for later readout and use.

The enable signal 132 is at the dummy value at the beginning of each of the remaining cycles of the clock signal clk. The enable signal 132 at the dummy value indicates that the data word (DO) generated in each of the remaining clock cycles is not a desired data word. In response to the enable signal at the dummy value, the memory controller 124 generates the address signal 134 in a single address that causes the memory to perform dummy writes in which the respective data words are written to memory location 1023. Memory location 1023 is the memory location constituting dummy memory 125, i.e., the part of memory 122 to which dummy writes to memory are made. Each writing of a data word to the dummy memory constitutes a dummy write to memory.

It is not critical that the data words output by the analog/digital circuit 120 be written in the dummy writes to memory. The data words generated by the analog/digital circuit 120 and determined not to be desired data words can be discarded, and any data word, for example, a fixed data word or a random data word, can be written to the dummy memory 125 because data words written to the dummy memory are not later read out.

In the example shown, memory location 1023 of the memory 122 constitutes the dummy memory 125, i.e., memory into which dummy writes to memory are made. In this example, the dummy memory 125 is a single memory location in the memory 122. In other embodiments, the dummy memory 125 is a block or range of memory locations in the memory 122. Alternatively, the dummy memory 125 can be comparable in size with the acquisition memory 123. The dummy memory 125 can also be electrically and/or physically separate from the acquisition memory 123. A dummy write to memory occurs when a data word is written to the dummy memory 125. The memory location address is n-bits wide, where n is an integer selected for the particular memory architecture.

The power consumption and noise output of the memory 122 remain relatively constant during operation of the mixed signal circuit 140 because a write to memory is performed every clock cycle. Thus, variations in noise and temperature are reduced.

Figure 3:
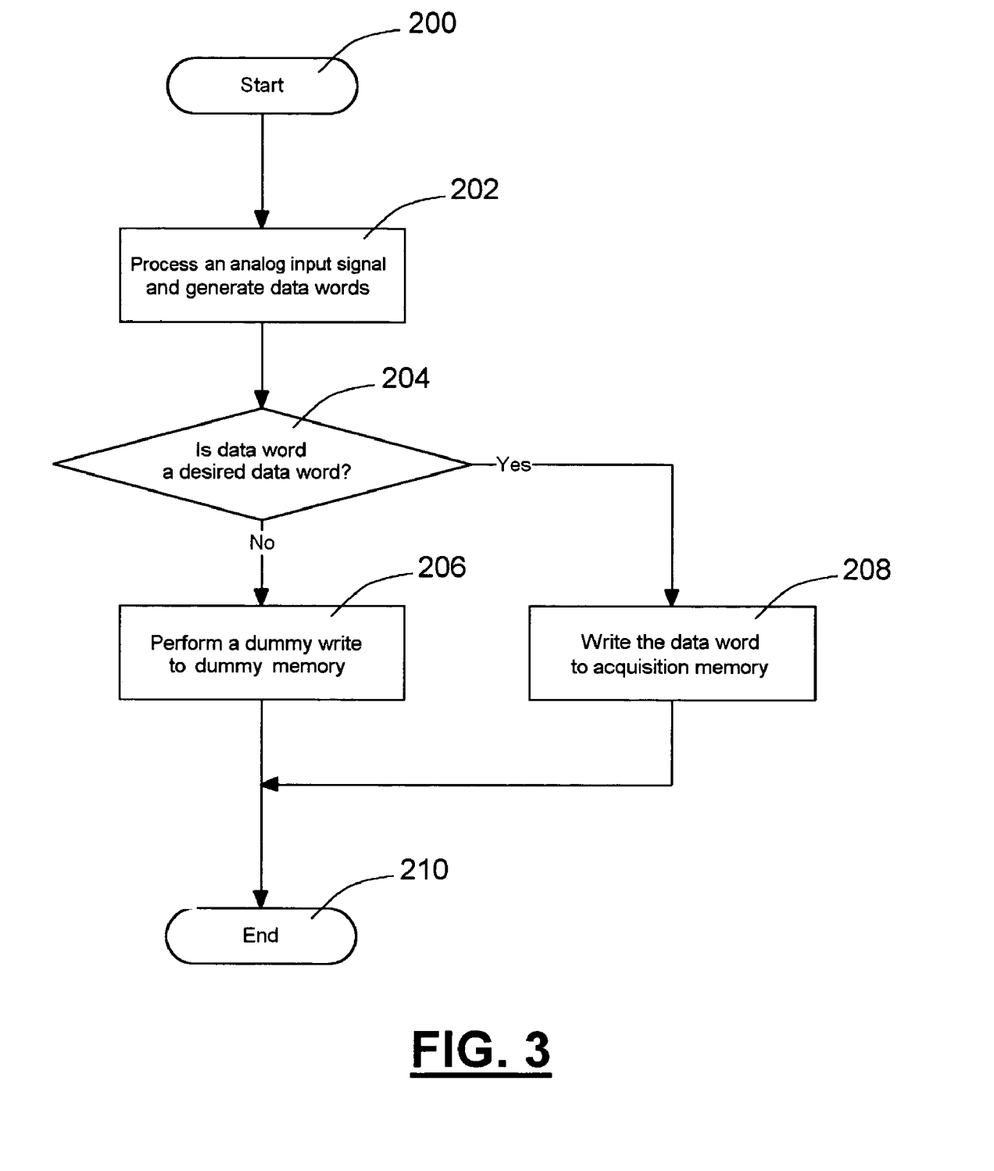
FIG. 3 is a flow chart showing another embodiment of a method according to the invention for reducing variations in noise and temperature in a mixed-signal circuit.

FIG. 3 is a flow chart showing another embodiment of a method in accordance with the invention for reducing variations in noise and temperature in a mixed-signal circuit. In this embodiment, the dummy writes to memory write any data words to dummy memory. An analog input signal is processed and data words are generated. Data words that are determined to be desired data words are written to memory for later use. Additionally, a dummy write to memory is performed for each data word that is not determined to be a desired data word. In the dummy write to memory, any data word, for example, a predetermined data word or a random data word, is written to memory. As a result, a write to memory is performed on every clock cycle. Performing a write to memory on every clock cycle reduces variations in circuit noise and operating temperature in the mixed-signal circuit.

Referring to FIG. 3, which provides a specific practical example of the present invention, the method starts at block 200. In block 202, the analog input signal is processed and data words are generated. The processing is performed by an analog circuit electrically proximate memory. In block 204, a determination is made of whether each data word is a desired data word, i.e., a data word to be written to memory for later readout and use. In some embodiments, the determination involves evaluating whether external logic has provided a signal identifying the data word as a desired data word. In one embodiment, an enable signal at an acquisition value indicates that the data word is a desired data word, whereas the enable signal at a dummy value indicates that the data word is not a desired data word. In this case, determining whether the data word is a desired data word involves determining whether the enable signal is at the acquisition value or the dummy value. In other embodiments, the determination involves no examination of the data word itself, as noted above.

Block 206 is performed when the data word is determined not to be a desired data word. In block 206, a dummy write to dummy memory is performed. The dummy write writes any data word, for example, a fixed data word or a random data word, to dummy memory. The method then ends at block 210. Block 208 is performed when the data word is determined to be a desired data word. In block 208, the data word is written to acquisition memory. The method then ends at block 210. In one embodiment, the method starts again at 200.

Because writes to memory occur on every clock cycle, even when the data word generated in block 202 is not a desired data word and is not going to be used, the circuit noise and temperature of the mixed-signal circuit remain relatively constant.

Figure 4A:
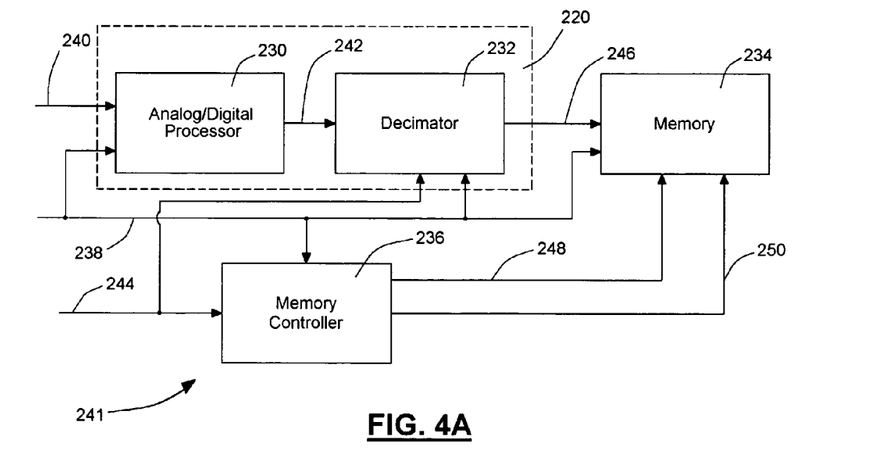
FIGS. 4A and 4B are a block diagram and a timing diagram, respectively, of a mixed-signal circuit having reduced variations in noise and temperature according to another embodiment of the invention.
Figure 4B:
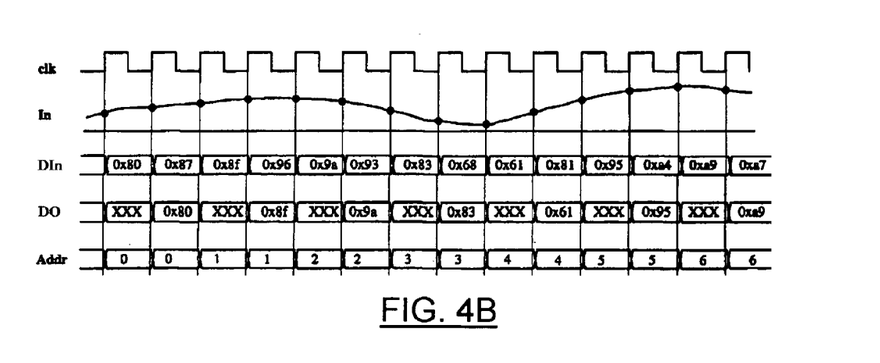

FIGS. 4A and 4B are a block diagram and timing diagram, respectively, of a mixed-signal circuit 241 that incorporates noise reduction in accordance with another embodiment of the invention. The mixed-signal circuit can be any circuit that has analog signals and digital signals in the same circuit. In one example, the mixed-signal circuit is an analog-to-digital converter. Analog-to-digital converters sometimes employ decimation to reduce the number of data words stored in memory relative to the number of data words generated by the analog-to-digital converter. Decimation increases the duration of the analog signal that can be converted into data words that can be stored in memory of a given size. However, conventional decimation writes the data words to memory intermittently, which causes variations in circuit noise and temperature, as described above.

In mixed-signal circuit 241, a data word is written to memory on every clock cycle. In the example shown, the desired data words and data words that are not desired data words and would normally be discarded by the decimation are written to different locations in memory. As a result, a write to memory is performed every clock cycle.

Referring to FIG. 4A, which provides a specific practical example of the present invention, the mixed-signal circuit 241 is composed of an analog/digital circuit 220, a memory 234, and a memory controller 236. The memory 234 is electrically proximate to the analog/digital circuit 220, i.e., activity in the memory 234 generates noise or signals detectable at the analog/digital circuit 220. The analog/digital circuit 220 is composed of an analog/digital processor 230 and a decimator 232. A clock signal 238 is provided to each of the components of the circuit 241. An analog input signal 240 is provided to the analog/digital circuit 220. The analog/digital processor 230 processes the analog input signal 240 and generates raw digital data words 242. The analog/digital processor 230 can be any circuit that processes an analog signal and generates digital data words. In one embodiment, the analog/digital processor 230 is an analog-to-digital converter. A decimation ratio signal 244 provided to the decimator 232 and the memory controller 236 determines the decimation ratio of the decimator 232 and indicates the decimation ratio to the memory controller 236. The decimator 232 receives the raw data words 242 and provides output data words 246 to the memory 234. The memory controller 236 provides an address signal 248 and read/write signal 250 to the memory 234.

FIG. 4B shows a timing diagram for the mixed-signal circuit 241 shown in FIG. 4A. In this example, the decimator 232 decimates the raw data words by a decimation ratio of two, i.e., the decimator outputs alternate ones of the raw data words 242 to the memory 234 as alternate ones of the output data words 246. In other words, the raw data words generated by the analog/digital circuit on alternate clock cycles are desired data words and are to be written to memory for later readout and use. The decimation ratio, i.e., the number of clock cycles that occur between consecutive ones of the desired data words being written to memory, is set by the decimation ratio signal 244.

The clock signal 238 (clk) provided to each of the components of the mixed-signal circuit 241 coordinates operations and data flow. The analog input signal 240 (In) is any analog signal, shown here varying in amplitude over time. The raw data words 242 (DIn) are N-bit binary data words generated by the analog/digital processor 230 in response to the analog input signal 240 (In). In an embodiment in which the analog/digital processor is an analog-to-digital converter, each data word is represents the amplitude of a time sample of the analog input signal 240. The analog/digital processor 230 generates a raw data word every clock cycle. The decimator 232 receives the raw data words and outputs output data words 246 at the same data rate. The output data words include desired data words and dummy data words. Each output data word 246 (DO) output by the decimator 232 is either a raw data word 242 (DIn), i.e., a desired data word, or a dummy data word. The dummy data word may be the raw data word that the decimator 232 would otherwise discard, a fixed data word, a random data word or some other data word. Thus, the decimator outputs to the memory 234 an output data word of some type on every clock cycle. Whether or not the output data word is a desired data word depends on the clock cycle in which the data word is output. The address signal 248 (Addr) determines the location in memory 234 to which each output data word 246 (DO) is written.

The memory controller 236 maintains the memory address signal 248 (Addr) constant for the number of clock cycles corresponding to the decimation ratio, then changes the address signal 248 (Addr) to a new address. On the clock cycle before the address signal changes, the output data word 246 (DO) output by the decimator 232 is a desired data word. Consequently, the last data word written to the memory 234 before the address signal changes is a desired data word. On all other clock cycles, each output data word 246 (DO) output by the decimator 232 is a dummy data word that is to be written to memory 234 in each of those clock cycles. Since the memory address does not advance during such clock cycles, the dummy data words are written in the same memory location as one another. Each dummy data word written to the memory location overwrites the previously-written dummy data word. The last dummy data word written to the memory location is overwritten by the desired data word. Consequently, the dummy data words can be any data words. When the decimation ratio is greater than two, each dummy data word is overwritten by the next dummy data word and, eventually, by the desired data word.

Dummy writes to memory are performed between the writes to memory of successive desired data words generated by the analog/digital circuit 220. A dummy write to memory occurs when each data word that is not a desired data word is written to the memory. The write address changes after each desired data word has been written.

An example of the operation of the mixed-signal circuit 204 will now be described in detail with reference to FIG. 4B, and specifically to the lines labelled clk, DO and Addr. In this example, the output data words (DO) output by the decimator 232 in even-numbered clock cycles are determined to be desired data words and those output in odd-numbered clock cycles are determined to be dummy data words. The output data word 246 (DO) output on the rising edge of the first clock cycle is output in an odd-numbered clock cycle, and is determined to a dummy data word, indicated by XXX. The dummy data word is written into the memory location 0. The dummy data word can be any data word, because the dummy data word is later overwritten by a desired data word.

The output data word 246 (DO) output on the rising edge of the second clock cycle is output in an even-numbered clock cycle and is therefore determined to be a desired data word, indicated by 0×80 (80 hexadecimal). The memory address (Addr) is maintained at 0 on the rising edge of the second clock cycle.

On the rising edge of the third clock cycle, the output data word 0×80 is written to the memory 234 at memory location 0. The output data word, a desired data word, overwrites the dummy data word stored in memory location 0. Additionally, the output data word 246 (DO) output by the decimator is updated and the memory controller increments the memory location to 1. The output data word is output in an odd-numbered clock cycle, and is consequently determined to be a dummy data word, identified by XXX.

A process similar to that described above with reference to the first and second clock cycles continues with the writes to each memory location alternating between first writing a dummy data word and the overwriting the dummy data word with a desired data word. The temperature and noise output of the memory 234 remain relatively constant during operation of the mixed signal circuit 241 regardless of the decimation ratio because an output data word, i.e., a dummy data word or a desired data word, is written to memory every clock cycle.

In other embodiments, a decimation ratio different from that exemplified above is used. Typical decimation ratios are 2, 4, 5 and 10. For a decimation ratio of 5, dummy writes to a given memory location occur in four consecutive clock cycles and the last dummy data word written to the given memory location is overwritten with a desired data word in the fifth clock cycle. Selection by the decimator of the desired data word can occur in clock cycles different from the last clock cycle provided the memory controller changes the memory address in the same clock cycle as that in which the desired data word is written to the memory. In other words, the desired data word need not be selected on the last clock cycle as in the decimation by 2 example described above. For a decimation ratio of 5, the desired data word can be selected in any clock cycle from clock cycle one to clock cycle five.

Other circuits and processes can be used to perform the decimation. As noted above, a decimator located between the analog/digital circuit and the memory is conventionally used. In other conventional embodiments, the decimator is included in the memory controller and performs the decimation by subsampling the data words output by the analog/digital circuit. However, such conventional subsampling writes to memory intermittently, giving rise to the noise and temperature variations described above.

In accordance with the invention, the decimator may be included in the memory controller as follows. The raw digital words 242 generated by the analog/digital processor 230 are fed to the memory 234. The memory controller 236 operates as a decimator by holding the address signal 248 fed to the memory 234 constant for a predetermined number of clock cycles equal to the decimation ratio. In each of all but the last of the predetermined number of clock cycles, a dummy write to memory is performed in which the respective raw data word 242 is written to the location in the memory 234 defined by the address signal 248 as a dummy data word. In the last of the predetermined number of clock cycles, the respective raw data word 242 is written to the location in the memory 234 defined by the address signal 248 as a desired data word. The memory controller changes 236 the address signal 248 after each desired data word has been written. In this way, the memory controller 236 subsamples the raw data words 242 output by the analog/digital processor 230 once in each predetermined number of clock cycles, but the additionally dummy writes to memory ensure that data words are written to the memory every clock cycle.

In an alternative embodiment, all dummy writes to memory are made to the same memory address. In this case, this memory address defines the portion of the memory 234 that is dummy memory. The memory addresses to which the writes to memory are performed in the last of the predetermined number of clock cycles are changed as described above.

Figure 5:
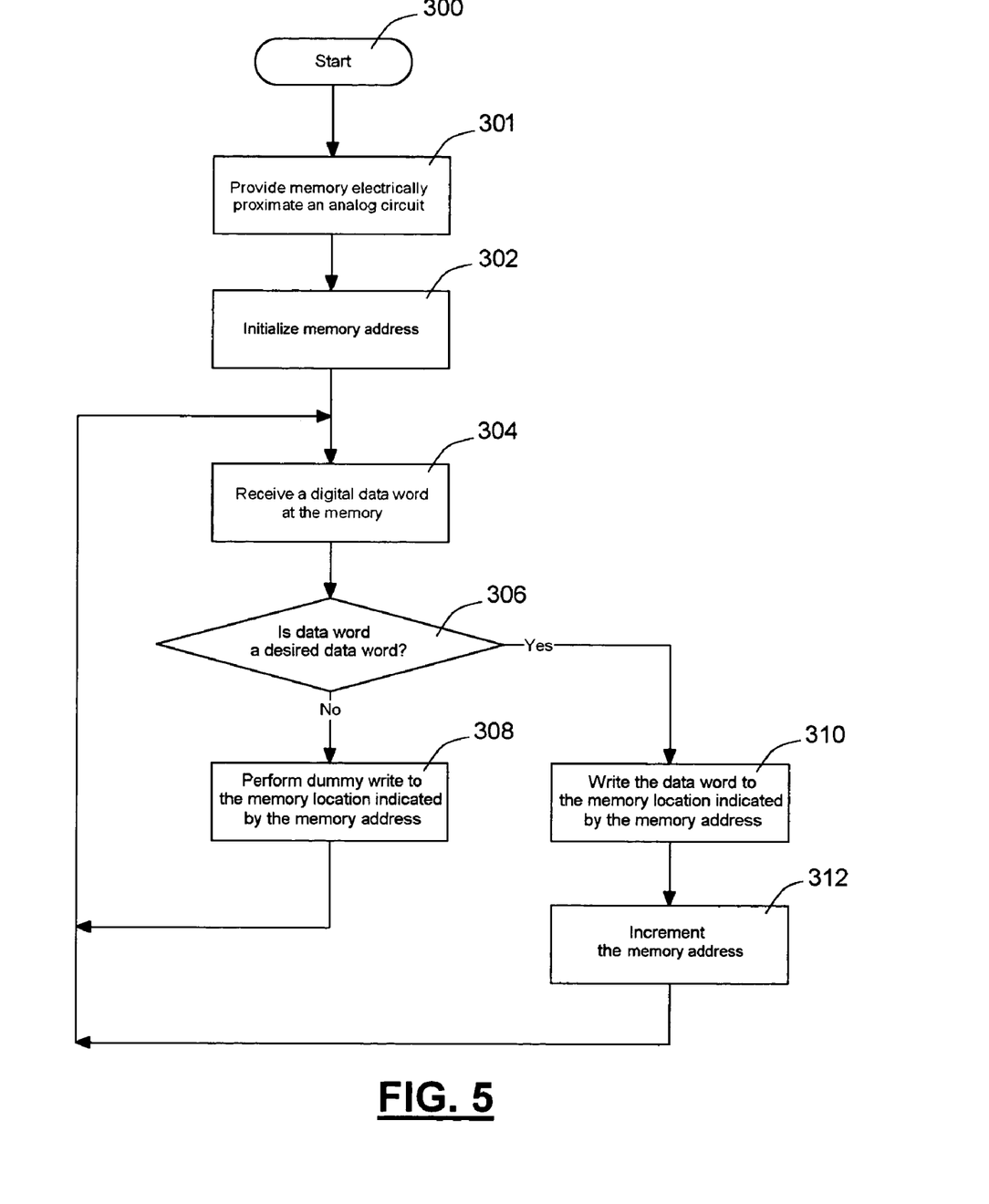
FIG. 5 is a flow chart showing another embodiment of a method according to the invention for reducing variations in noise and temperature in a mixed-signal circuit.

FIG. 5 shows a flow chart of another embodiment of a method in accordance with the invention for reducing noise in a mixed-signal circuit. In this embodiment, the memory is electrically proximate an analog circuit and includes memory locations corresponding to memory addresses. The dummy writes to memory involve writing to the memory locations defined by the respective memory addresses. Digital data words are received at the memory. Data words that are desired data words are written to memory for later use. For each data word that is not a desired data word, a dummy write to memory is performed. As a result, a write to memory is performed on every clock cycle. Performing a write to memory on every clock cycle reduces variations in circuit nose and temperature.

Referring to FIG. 5, which provides a specific practical example of the present invention, the method starts in block 300. In block 301, memory electrically proximate an analog circuit is provided. In block 302, a memory address is initialized. In block 304, a digital data word is received at the memory. In block 306, a determination is made as to whether the data word is a desired data word, i.e., a data word to be written to memory for later readout and use. Block 308 is performed when the data word is determined not to be a desired data word. In block 308, a dummy write to the memory location indicated by the memory address is performed. In one embodiment, the dummy write includes writing a dummy data word to the memory location indicated by the memory address. In another embodiment, the dummy write includes writing the data word that is not a desired data word to the memory location indicated by the memory address. The method then continues at block 304.

Blocks 310 and 312 are performed when the data word is determined to be a desired data word. In block 310, the data word is written to the memory location indicated by the memory address. In block 312, the memory address is incremented. The method then continues at block 304 with the new memory address.

While the embodiments of the invention disclosed herein are presently considered to be preferred, various changes and modifications can be made without departing from the scope of the invention. For example, the examples described above include an analog-to-digital converter with on-chip memory used to store acquisition data. However, the invention can be embodied in any mixed-signal circuit that uses analog and digital signals in the same circuit. The scope of the invention is indicated in the appended claims, and all changes that come within the meaning and range of equivalents are intended to be embraced therein.

The invention claimed is:

1. A method for reducing variations in noise and temperature in a mixed-signal circuit, the method comprising:
providing a memory comprising a dummy memory and an acquisition memory;
receiving a digital data word at the memory;
performing a write to the acquisition memory when the data is a n-th data word in a repeating set of n data words; and
performing a dummy write to the dummy memory when the data word is not the n-th data word.

2. The method of claim 1, further comprising:
processing an analog input signal to generate the n-th data word.

3. The method of claim 1, in which:
the dummy memory is the same as the acquisition memory.

4. The method of claim 1, further comprising:
providing an enable signal having a dummy value and an acquisition value; and
performing the dummy write to the dummy memory when the enable signal is at the dummy value.

5. The method of claim 1, in which the dummy memory comprises no more than a single memory location in the memory.

6. The method of claim 1, in which the dummy memory comprises a range of memory locations in the memory.

7. The method of claim 1, further comprising:
using a decimating ratio to generate the set of n data words whereby the n-th data word is a desired data word and the remaining data words in the set of n data words are dummy data words.

8. A mixed-signal circuit, comprising:
an analog circuit;
a memory configured to receive data words; and
a memory controller coupled to the memory, the memory controller operable to write to the memory every n-th data word in a stream of data words as a desired data word and additionally to perform a dummy write to memory for each of the other data words in the stream of data words wherein each of the other data words comprises a dummy data word.

9. The circuit of claim 8, additionally comprising an analog/digital circuit operable to process an analog input signal for generating the n-th data word.

10. The circuit of claim 9, in which the analog/digital circuit comprises an analog-to-digital converter.

11. The circuit of claim 8, in which:
the memory controller is responsive to an enable signal for generating an address signal;
the enable signal has a dummy value when the data word is not the n-th data word and an acquisition value when the data word is the n-th data word;
the memory comprises dummy memory and acquisition memory; and
the memory controller provides a first address signal corresponding to the dummy memory when the enable signal is at the dummy value and provides a second address signal corresponding to the acquisition memory when the enable signal is at the acquisition value.

12. The circuit of claim 11, in which the dummy memory comprises a single memory location in the memory.

13. The circuit of claim 11, in which the first address signal is the same as the second address signal.

14. The circuit of claim 8, in which:
the memory controller generates an address signal;
the memory stores the dummy data word and the desired data word where designated by the address signal in each clock cycle; and
the memory controller is operable to maintain the address signal for n number of clock cycles.

15. The circuit of claim 14, in which:
the memory controller is operable to change the address signal after n number of clock cycles.

16. The circuit of claim 8, in which:
the memory controller is operable to generate a first address signal for a n-th clock cycle in a set of n clock cycles and a second address signal for the other clock cycles; and
the memory stores the desired data word where designated by the first address signal and the each of the other data words where designated by the second address signal.

17. The circuit of claim 16, in which the first address signal is the same as the second address signal.

18. A mixed-signal circuit, comprising:
an analog circuit;
a memory controller responsive to a decimation ratio signal for generating an address signal;
a decimator operable in response to the decimation ratio signal to generate output data words comprising, in a given number of clock cycles, a dummy data word and a desired data word; and
a memory operable to receive the output data words from the decimator and to store the dummy data word and the desired data word where designated by the address signal in each of the clock cycles.

19. The circuit of claim 18, in which the memory controller is operable to change the address signal after the last of the given number of clock cycles.

20. The circuit of claim 18, in which the memory controller includes the decimator.

* * * * *